United States Patent
Sugiyama

(10) Patent No.: US 9,728,178 B2
(45) Date of Patent: Aug. 8, 2017

(54) PARTICULAR SIGNAL CANCEL METHOD, PARTICULAR SIGNAL CANCEL DEVICE, ADAPTIVE FILTER COEFFICIENT UPDATE METHOD, ADAPTIVE FILTER COEFFICIENT UPDATE DEVICE, AND COMPUTER PROGRAM

(71) Applicant: NEC CORPORATION, Tokyo (JP)

(72) Inventor: Akihiko Sugiyama, Tokyo (JP)

(73) Assignee: NEC Corporation, Tokyo (JP)

(*) Notice: Subject to any disclaimer, the term of this patent is extended or adjusted under 35 U.S.C. 154(b) by 161 days.

(21) Appl. No.: 14/587,276

(22) Filed: Dec. 31, 2014

(65) Prior Publication Data

US 2015/0117658 A1 Apr. 30, 2015

Related U.S. Application Data

(62) Division of application No. 12/675,492, filed as application No. PCT/JP2008/064727 on Aug. 19, 2008, now Pat. No. 8,953,776.

(30) Foreign Application Priority Data

Aug. 27, 2007 (JP) .................... 2007-220448

(51) Int. Cl.
G10K 11/16 (2006.01)
H04M 9/08 (2006.01)
(Continued)

(52) U.S. Cl.
CPC ............ *G10K 11/16* (2013.01); *H04M 9/082* (2013.01); *G10K 2210/505* (2013.01);
(Continued)

(58) Field of Classification Search
None
See application file for complete search history.

(56) References Cited

U.S. PATENT DOCUMENTS 5,608,804 A * 3/1997 Hirano ............... H03H 21/0012
379/406.08
5,859,914 A 1/1999 Ono et al.
(Continued)

FOREIGN PATENT DOCUMENTS

JP 7-202765 A 8/1995
JP 10-41859 A 2/1998
(Continued)

OTHER PUBLICATIONS

"Argument" dated Sep. 22, 2004 concerning JP Application 2000-255710, [online], Mar. 26, 2007, [retrieval date Nov. 14, 2008], retrieved by utilizing Internet (at the site of Industrial Property Digital Library (IRDL)) <www.ipdl.inpit.go.jp?Tokujitu/pfwj.ipdl?N0000=118>.

(Continued)

*Primary Examiner* — Fan Tsang
*Assistant Examiner* — Jeffrey Lytle
(74) *Attorney, Agent, or Firm* — Foley & Lardner LLP

(57) ABSTRACT

By using the adaptive filter, the reference input signal is processed so as to identify a pseudo-signal of a particular signal to be deleted. The pseudo-signal is subtracted from the mixture containing a target signal inputted from a microphone, the particular signal to be deleted, and a noise so as to obtain an error signal. A stationary noise is estimated to obtain a stationary noise estimated value. A non-stationary noise is estimated to obtain a non-stationary noise estimated value. The stationary noise estimated value is mixed with the non-stationary estimated value to obtain a mixed noise estimated value. An update amount is calculated according to a correlation value between the error signal and the reference input signal, and the mixed noise estimated value. According to the update amount, a coefficient of the adaptive filter is updated.

6 Claims, 10 Drawing Sheets

(51) Int. Cl.
*H04B 3/23* (2006.01)
*H04R 3/02* (2006.01)
*H03H 21/00* (2006.01)

(52) U.S. Cl.
CPC ....... *H03H 2021/0078* (2013.01); *H04B 3/23* (2013.01); *H04R 3/02* (2013.01)

(56) References Cited

U.S. PATENT DOCUMENTS

| | | | |
|---|---|---|---|
| 6,570,985 B1* | 5/2003 | Romesburg | H04B 3/23 379/390.02 |
| 2002/0013695 A1* | 1/2002 | Belt | H04R 3/00 704/205 |
| 2003/0040908 A1 | 2/2003 | Yang et al. | |
| 2004/0049380 A1* | 3/2004 | Ehara | G10L 19/012 704/219 |
| 2006/0136203 A1 | 6/2006 | Ichikawa | |
| 2006/0251261 A1 | 11/2006 | Christoph | |
| 2008/0101622 A1 | 5/2008 | Sugiyama | |
| 2010/0284546 A1 | 11/2010 | DeBrunner et al. | |

FOREIGN PATENT DOCUMENTS

| | | |
|---|---|---|
| JP | 63-279622 A | 11/1998 |
| JP | 2000-252891 A | 9/2000 |
| JP | 3631668 B2 | 12/2004 |
| WO | WO 2006/049260 A1 | 11/2006 |

OTHER PUBLICATIONS

Bernard Widrow et al., The LMS Algorithm, Adaptive Signal Processing, 1985, pp. 99-115, Prentice-Hall, Inc.
Christina Breining et al., Acoustic Echo Control, IEEE Signal Processing Magazine, Jul. 1999, pp. 42-69.
Michael L. Honig et al., LMS Stochastic Gradient Algorithm, Adaptive Filters: Structures, Algorithms, and Applications, The Kluwer International Series in Engineering and Computer Science, 1985, pp. 54-57, Kulwer Academic Publishers.
Rainer Martin, Spectral Subtraction Based on Minimum Statistics, Signal Processing VII: Theories and Applications, European Associates for Signal Processing, 1994, pp. 1182-1185.
P. P. Vaidyanathan, Maximally Decimated Filter Banks, Multirate Systems and Filter Banks, 1993, pp. 188-271.
B. Farhang-Boroujeny, Transform Domain Adaptive Filters, Adaptive Filters, Theory and Applications, 1998, pp. 201-291.

\* cited by examiner

PARTICULAR SIGNAL CANCEL METHOD, PARTICULAR SIGNAL CANCEL DEVICE, ADAPTIVE FILTER COEFFICIENT UPDATE METHOD, ADAPTIVE FILTER COEFFICIENT UPDATE DEVICE, AND COMPUTER PROGRAM

This application is a Divisional of U.S. application Ser. No. 12/675,492, filed Feb. 26, 2010; which is the US National Phase of International Application No. PCT/JP2008/064727, filed Aug. 19, 2008, which claims priority to Japanese Application No. 2007-220448, filed Aug. 27, 2007, the disclosures of all of which are hereby incorporated by reference in their entirety.

APPLICABLE FIELD IN THE INDUSTRY

The present invention relates to an erase method and an erase device for erasing a particular signal by employing an adaptive filter in an echo canceller, a noise canceller, a microphone array, or the like, an update method and an update device of an adaptive filter coefficient, and a computer program thereof.

BACKGROUND ART

As a method of erasing a particular signal by employing an adaptive filter, the method in which a transversal type adaptive filter is employed is widely known. The adaptive filter, which is widely employed in an echo canceller, a noise canceller, a microphone array, or the like, generates a replica of the signal adaptively that is erased, and erases the signal by subtracting the replica from the signal.

Non-patent document 1 discloses the echo canceller as a technology of erasing an echo that leaks into a reception side from a transmission side in a four-line side of a two-line/four-line conversion circuit. The echo canceller operates in such a manner that it suppress the echo that leaks into the reception circuit side from the transmission circuit in the four-line side of the two-line/four-line conversion circuit by employing an adaptive FIR (Finite Impulse response) filter having a tap coefficient of which a numerical value is equal to or exceeds an impulse response length of an echo path and generates a pseudo echo (echo replica) corresponding to a transmitted signal. The acoustic echo canceller described in Non-patent document 2 is also known as a technology of erasing an acoustic echo, which is generated due to an acoustic coupling made between a loudspeaker for reproducing an acoustic signal and a microphone, with a similar technical principle.

In these echo cancellers, taking a scheme for correlating an error signal, which is obtained by subtracting the pseudo echo from a mixture in which the echo and the received signal are mixed, with a transmitted signal allows each tap coefficient of the adaptive filter to be modified. As a representative of such a coefficient modification algorithm of the adaptive filter, the LMS algorithm described in the Non-patent document 1 and the normalized LMS (least mean square) algorithm or a NLMS algorithm described in the Non-patent document 3 are widely known.
Patent document 1: JP-P1995-202765A
Non-patent document 1: Adaptive Signal Processing, 1985, Prentice-Hall Inc., USA
Non-patent document 2: Acoustic Echo Control (IEEE Signal Processing Magazine, PP. 42-69, July, 1999)
Non-patent document 3: Adaptive Filters, 1985, Kulwer Academic Publisher, USA
Non-patent document 4: Proceedings of European Signal Processing Conference, PP. 1182-1185, September, 1994
Non-patent document 5: Multirate Systems and Filter Banks, Prentice-Hall, 1993
Non-patent document 6: Adaptive Filters, Theory and Applications, John Wiley & Sons, 1998

Ideally, the error signal is equal to a difference between the echo and the echo replica (residual echo). However, realistically, the signals that disturb the update of the coefficient, for example, voice (near-end voice) that should be conveyed to a counterpart side, and a background noise exist. When these disturbing signals are smaller as compared with the residual echo, the disturbing signals can be neglected, and the filter coefficient can be correctly modified by employing the NLMS algorithm. However, when these disturbing signals become large, a problem that the filter coefficient cannot be modified correctly is raised.

In addition, when the input signal (reference input signal) of the adaptive filter is a non-stationary signal like the voice, as is the case may be, the filter coefficient cannot be correctly modified even though these disturbing signals are relatively small. This is due to the following reasons. At first, a reciprocal term of a reference input signal power is included in a step size for controlling a speed and a precision of the update of the filter coefficient, whereby the step size becomes very large when the reference input signal is very small. Further, the reason is that the echo is very small, correspondingly to the reference input signal, and the disturbing signal is relatively large as compared with the error signal. Thus, the filter coefficient results in being updated to a high level by employing not the error signal but the disturbing signal, and hence, the filter coefficient is not updated correctly.

The patent document 1 discloses the coefficient update algorithm that is capable of correctly updating the filter coefficient also in an environment in which the noise is large so as to cope with the problem that the filter coefficient cannot be correctly modified when the noise is large. The technology thereof is characterized in estimating the power of the reference input signal, and controlling the step size based upon a convex function such that a maximum value is gained when the foregoing reference input signal power coincides with a first threshold. Upon defining a coefficient vector, the error signal, a reference input signal vector at a discrete time (k) as w(k), e(k), and x(k), respectively, the coefficient update by the Patent document 1 can be expressed with the following equation.

[Numerical equation 1]

$$w(k+1) = w(k) + \frac{\mu_0 \sigma_x^2(k)}{\sigma_x^4(k) + \alpha \sigma_n^4(k)} e(k) x(k) = w(k) + \Delta w(k) \quad (1)$$

where $\sigma x^2(x)$ is a reference input power, $\sigma n^2(k)$ is an estimated noise power, $\mu_0$ and $\alpha$ are a constant, respectively. Further, Dw(k) is an updated quantity. $\sigma n^2(k)$ can be obtained with the following equation.

[Numerical equation 2]

$$\sigma_n^2(k+1) = \beta \sigma_n^2(k) + (1-\beta) e^2(k) \quad (2)$$

The noise estimated value is updated when the error signal is larger than the output of the adaptive filter.

DISCLOSURE OF THE INVENTION

Problems to be Solved by the Invention

The conventional method is a method of defining the value obtained by averaging the error signals based upon the Numerical equation 2 as a noise estimated value. This necessitates setting a time constant of the averaging to a large value so as to gain the noise estimated value with a sufficient estimation precision, and hence, a component of a non-stationary noise cannot be accurately estimated. To the contrary, setting the time constant of the averaging to a small value, and taking precedence of followingness to the component of the non-stationary noise lead to a decline in the precision at which the component of the stationary noise is estimated. This means that the noise in which the stationary noise/non-stationary noise are mixed cannot be estimated with a sufficient precision and the adequate step size cannot be obtained. That is, there exists a problem that the coefficient update of the adaptive filter cannot be controlled appropriately for the noise in which the stationary noise/non-stationary noise are mixed.

An object of the present invention is to provide a method and a devise for erasing a particular signal with the adaptive filter provided with a function capable of appropriately controlling the coefficient update of the adaptive filter for the noise in which the stationary noise/non-stationary noise are mixed, as well as a computer program thereof

Means to Solve the Problem

From a first viewpoint of the present invention, a particular signal erase method is characterized in including: (a) a process of processing a reference input signal with an adaptive filter and obtaining a pseudo signal of a particular signal that should be erased; (b) a process of subtracting the above pseudo signal from a mixture containing a target signal inputted from a microphone, the particular signal that should be erased, and a noise, and obtaining an error signal; (c) a process of estimating a stationary noise and obtaining a stationary noise estimated value; (d) a process of estimating a non-stationary noise and obtaining a non-stationary noise estimated value; (e) a process of mixing the foregoing stationary noise estimated value and the foregoing non-stationary noise estimated value and obtaining a mixed noise estimated value; and (f) a process of obtaining a correlation value between the foregoing error signal and the foregoing reference input signal, calculating an update amount from the above correlation value and the foregoing mixed noise estimated value, and updating a coefficient of the foregoing adaptive filter based upon the above update amount.

From a second viewpoint of the present invention, a particular signal erase device is characterized in including: an adaptive filter that processes a reference input signal and obtains a pseudo signal of a particular signal that should be erased; a subtracter that subtracts the above pseudo signal from a mixture containing a target signal inputted from a microphone, the particular signal that should be erased, and a noise, and obtains an error signal; a stationary noise estimation unit that estimates a stationary noise and obtains a stationary noise estimated value; a non-stationary noise estimation unit that estimates a non-stationary noise and obtains a non-stationary noise estimated value; a mixing unit that mixes the foregoing stationary noise estimated value and the foregoing non-stationary noise estimated value, and obtains a mixed noise estimated value; an update amount calculation unit that obtains a correlation value between the foregoing error signal and the foregoing reference input signal, calculates an update amount from the above correlation value and the foregoing mixed noise estimated value, and updates a coefficient of the foregoing adaptive filter based upon the above update amount.

From a third viewpoint of the present invention, an adaptive filter coefficient update method of is characterized in including: (a) a process of estimating a stationary noise and obtaining a stationary noise estimated value; (b) a process of estimating a non-stationary noise and obtaining a non-stationary noise estimated value; (c) a process of mixing the foregoing stationary noise estimated value and the foregoing non-stationary noise estimated value, and obtaining a mixed noise estimated value; (d) a process of calculating a coefficient update step size for securing a large value when the foregoing mixed noise estimated value is small, and a small value when the foregoing mixed noise estimated value is large; and (e) a process of updating a coefficient of an adaptive filter by employing the above step size.

From a fourth viewpoint of the present invention, an adaptive filter coefficient update device of is characterized in including: a stationary noise estimation unit that estimates a stationary noise and obtains a stationary noise estimated value; a non-stationary noise estimation unit that estimates a non-stationary noise and obtains a non-stationary noise estimated value; a mixing unit that mixes the foregoing stationary noise estimated value and the foregoing non-stationary noise estimated value, and obtains a mixed noise estimated value; a step size calculation unit that calculates a coefficient update step size for securing a large value when the foregoing mixed noise estimated value is small, and a small value when the foregoing mixed noise estimated value is large; and an update amount calculation unit that calculates an update amount for updating a coefficient of an adaptive filter by employing the above step size.

An Advantageous Effect of the Invention

In the noise estimation of the present invention, the estimation precision of each of the stationary noise and the non-stationary noise is high because both noises are separately estimated based upon stationarity and non-stationarity of the noise, and the update of the adaptive filter coefficient can be appropriately controlled for various types of the noises because both noises are mixed after estimation and the update of the adaptive filter coefficient is controlled based upon its information.

Figure 1:
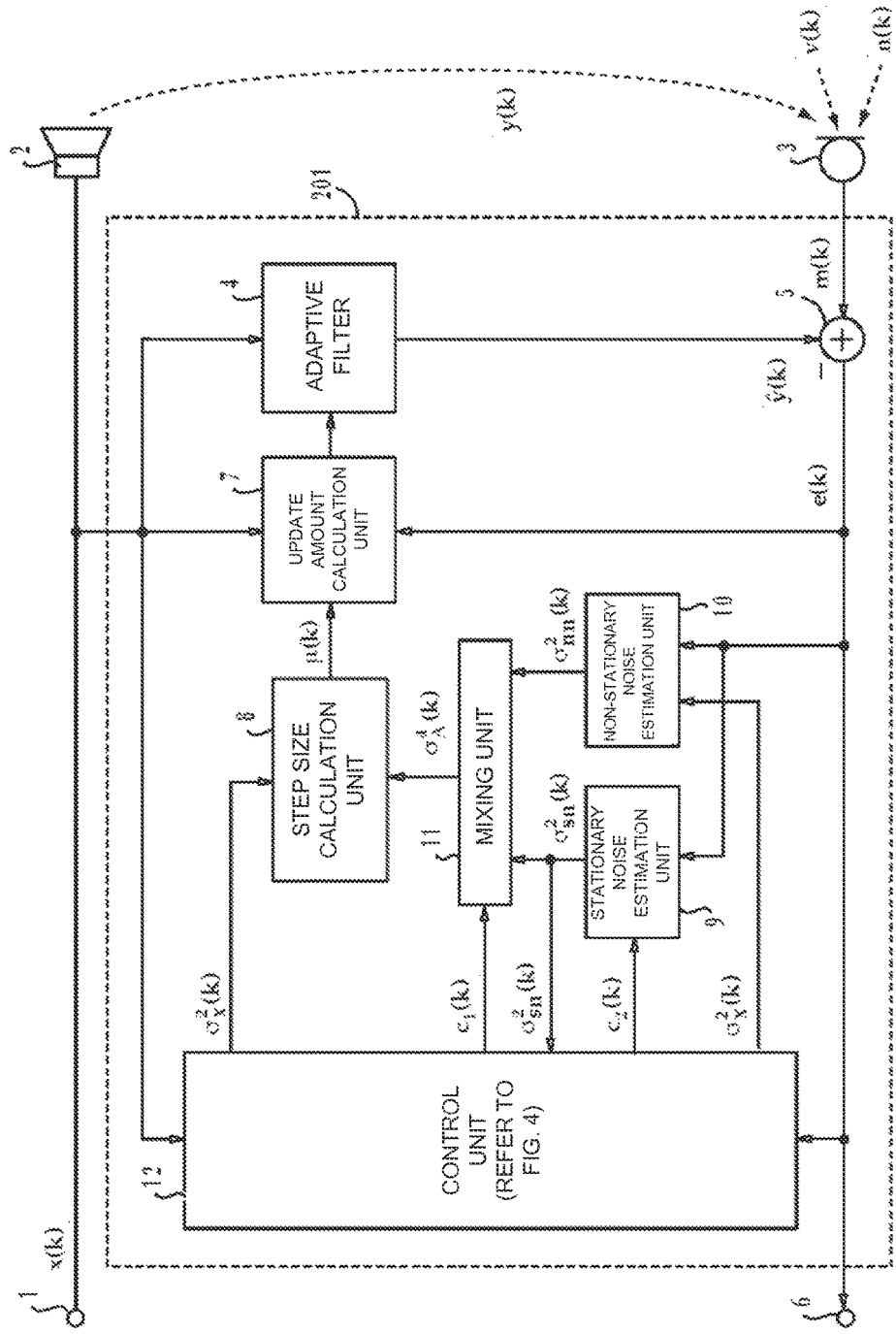
FIG. 1 is a block diagram illustrating a first embodiment of the present invention.

DESCRIPTION OF NUMERALS 1 input terminal
2 loudspeaker
3 and 14 microphones
4 adaptive filter
5 subtracter
6 output terminal
7 update amount calculation unit
8 step size calculation unit
9 stationary noise estimation unit
10 non-stationary noise estimation unit
11 mixing unit
12 control unit
12-1 control unit
15 and 16 analysis filter bank
17 composition filter bank
81 and 82 multipliers
83 adder
84 memory
85 divider
86 limiter
121 power calculation unit
122 correlation calculation unit
123 mixing control unit
123-1 mixing control unit
124 estimation control unit
201 echo canceller
202 subband echo canceller
300 noise canceller

BEST MODE FOR CARRYING OUT THE INVENTION

The first embodiment of the present invention will be explained as an echo canceller shown in FIG. 1. An echo canceller 201 is comprised of an adaptive filter 4, a subtracter 5, a non-stationary noise estimation unit 10, a stationary noise estimation unit 9, a mixing unit 11, a control unit 12, a step size calculation unit 8, and an update amount calculation unit 7. The mixing unit 11 mixes the stationary noise and the non-stationary noise estimated by the stationary noise estimation unit 9 and the non-stationary noise estimation unit 10, respectively, and the step size calculation unit 8 calculates the step size thereof, which is later described.

An far-end signal x(k) supplied as a reference input signal from an input terminal 1 is supplied to a loudspeaker 2, the adaptive filter 4, the update amount calculation unit 7, and the control unit 12. An output of the loudspeaker 2 reaches a microphone 3 as an echo y(k) via an acoustic space. A near-end signal v(k) and a background noise n(k) have been supplied to the microphone 3, and the components of these three signal including the echo y(k) are composed as a microphone signal m(k), and supplied to one of the inputs of the subtracter 5. The adaptive filter 4, upon receipt of the far-end signal, generates an echo replica y(k)-hat (the pseudo signal of the particular signal that should be erased) and supplies it to the other input of the subtracter 5. The subtracter 5 subtracts the above echo replica from the microphone signal, and supplies its result as an error signal e(k) to the output terminal 6, the control unit 12, the stationary noise estimation unit 9, the non-stationary noise estimation unit 10, and the update amount calculation unit 7. The update amount calculation unit 7 employs a step size μ(k) being supplied from the step size calculation unit 8, obtains a correlation value between the reference input signal x(k) and the error signal e(k) with the following equation, supplies it as an update amount Δw(k) to the adaptive filter 4, and updates a coefficient of the same filter.

[Numerical equation 3]

$$\Delta w(k) = \mu(k) e(k) x(k) \quad (3)$$

The step size μ(k) is obtained by performing a series of procedures of the step size calculation, namely, the stationary noise estimation, the non-stationary noise estimation, and the mixing thereof. That is, the step size μ(k), which acts as a modification coefficient of the correlation value between the reference input signal x(k) and the error signal e(k), governs the update amount Δw(k). The stationary noise estimation unit 9 inputs the error signal e(k) and a noise estimation control signal $c_2(k)$, and calculates a stationary noise power estimated value $\sigma sn^2(k)$ according to the following equation, and outputs it to the mixing unit 11.

[Numerical equation 4]

$$\sigma_{sn}^2(k+1) = \begin{cases} \beta \sigma_{sn}^2 + (1-\beta)e^2(k) & c_2(k)=1 \\ \sigma_{sn}^2(k) & c_2(k)=0 \end{cases} \quad (4)$$

Where β is a constant of which a value is 1 or less. What the Numerical equation 4 means that the stationary noise estimation unit 9 calculates the stationary noise power estimated value $\sigma sn^2(k)$ by performing a leakage integration for an error signal power $e^2(k)$ when $c_2(k)=1$, and outputs a one-sample-before integration value when $c_2(k)=0$. A window average, a method of minimum statistics, or the like in addition to the leakage integration is known as such an estimation method. The following equation corresponds to the Numerical equation 4 when the window average is employed.

[Numerical equation 5]

$$\sigma_{sn}^2(k+1) = \begin{cases} \sigma_{sn}^2(k) + \dfrac{\tilde{e}^2(k) - \tilde{e}^2(M)}{M} & c_2(k)=1 \\ \sigma_{sn}^2(k) & c_2(k)=0 \end{cases} \quad (5)$$

Where M is the number of samples that are employed for calculating the window average, and {tilde over ($e^2$)}(k) is a sample value sequence prepared by extracting only the error signal power $e^2(k)$ that corresponds to $c_2(k)=1$. That is, the window average of the window length M is calculated by adding 1/M times {tilde over ($e^2$)}(k) to just-before $\sigma sn^2(k)$ as information of the new sample, and subtracting 1/M times {tilde over ($e^2$)}(M) from just-before $\sigma sn^2(k)$ as information of the oldest sample only when $c_2(k)=1$. The following equation corresponds to the Numerical equation 4 when the method of minimum statistic is employed.

[Numerical equation 6]

$$\sigma_{sn}^2(k+1) = \begin{cases} \delta\min\{\tilde{e}^2(k-M+1), \tilde{e}^2(k-M+2), \ldots \tilde{e}^2(k)\} & c_2(k)=1 \\ \sigma_{sn}^2(k) & c_2(k)=0 \end{cases} \quad (6)$$

Where min {•} is a function of extracting a minimum value. That is, the minimum value of M samples of the sample value sequence prepared by extracting only the error signal power $e^2(k)$ that corresponds to $c_2(k)=1$ is extracted only when $c_2(k)=1$, and the value obtained by increasing the above minimum value by a factor of δ is defined as an estimated value of the stationary noise by the method of minimum statistics. The details of the method of minimum statistics are described in the Non-patent document 4, so detailed explanation thereof is omitted. The obtained stationary noise estimated value $\sigma sn^2(k)$ is conveyed to the mixing unit 11.

Additionally, obtaining the stationary noise estimated value $\sigma sn^2(k)$ with any method necessitates an initial value $\sigma sn^2(0)$ thereof. As an initial value of the stationary noise estimated value, the value obtained by averaging the error signal power $e^2(k)$, which is gained just after initiation of the operation, for a constant time, or the value obtained by increasing the minimum value during its time by a factor of a constant can be employed.

The non-stationary noise estimation unit 10 inputs the error signal e(k), and the power $\sigma x^2(k)$ of the reference input signal calculated by the control unit 12, and outputs the non-stationary noise estimated value $\sigma sn^2(k)$ to the mixing unit 11 based upon the following equation.

[Numerical equation 7]

$$\sigma_{nn}^2(k+1) = \frac{\beta}{|\sigma_x(k)|}e^2(k) \quad (7)$$

The mixing unit 11 inputs the stationary noise power estimated value $\sigma sn^2(k)$ and the non-stationary noise power estimated value $\sigma nn^2(k)$ from the stationary noise estimation unit 9 and the non-stationary noise estimation unit 10, respectively, and obtains a squared noise power estimated value $\sigma A^4(k)$ with the following equation while controlling a mixing ratio of these estimated values with a mixing control signal $c_1(k)$ supplied from the control unit 12.

[Numerical equation 8]

$$\sigma_A^4(k)=c_1(k)\sigma_{sn}^4(k)+(1-c_1(k))\sigma_{nn}^4(k) \quad (8)$$

The squared noise power estimated value $\sigma A^4(k)$ obtained with the procedures mentioned above is conveyed to the step size calculation unit 8.

Figure 2:
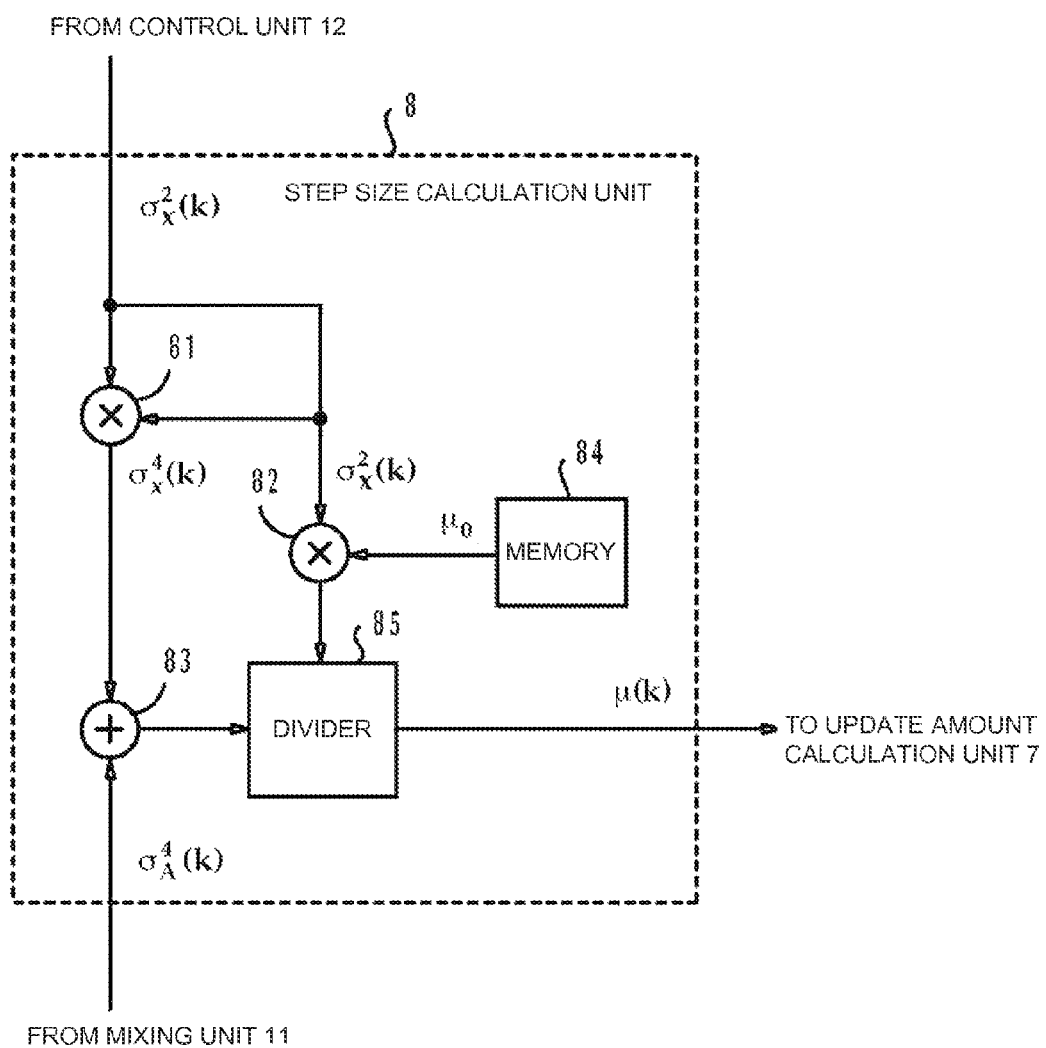
FIG. 2 is a block diagram illustrating a first configuration of a step size calculation unit of FIG. 1.

The step size calculation unit 8 inputs this squared noise power estimated value $\sigma A^4(k)$ and the reference input signal power $\sigma x^2(k)$ coming from the control unit 12, and calculates the step size μ(k), and conveys it the update amount calculation unit 7. FIG. 2 shows a first configuration of the step size calculation unit 8. The step size calculation unit 8 is configured of multipliers 81 and 82, an adder 83, a memory 84, and a divider 85. The reference input signal power $\sigma x^2(k)$ is supplied to both terminals of the multipliers 81, and the multipliers 81 supplies the squared values $\sigma x^4(k)$ of these reference input signal powers to one of the inputs of the adder 83. The same adder 83 obtains a sum $\sigma x^4(k)+\sigma A^4(k)$ from the squared value $\sigma x^4(k)$ of the reference input signal power and the squared noise power estimated value $\sigma A^4(k)$ supplied to the other input thereof, and supplies it to the divider 85. On the other hand, the multiplier 82 supplies a product $\mu 0\sigma x^2(k)$ of the reference input signal power $\sigma x^2(k)$ coming from the control unit 12 and a constant μ0 coming from the memory 84 to the divider 85. The divider 85 divides the product $\mu 0\sigma x^2(k)$ by the sum $\sigma x^4(k)+\sigma A^4(k)$ coming from the adder 83, and output a quotient thereof as a step size μ(k). That is, the step size μ(k) is expressed with the following equation.

[Numerical equation 9]

$$\mu(k) = \frac{\mu_0 \sigma_x^2(k)}{\sigma_x^4(k) + \sigma_A^4(k)} \quad (9)$$

Thus, when at least one of the mixed noise estimated value and the reference input signal power is increased, the update amount calculation unit 7 reduces the update amount Δw(k).

Figure 3:
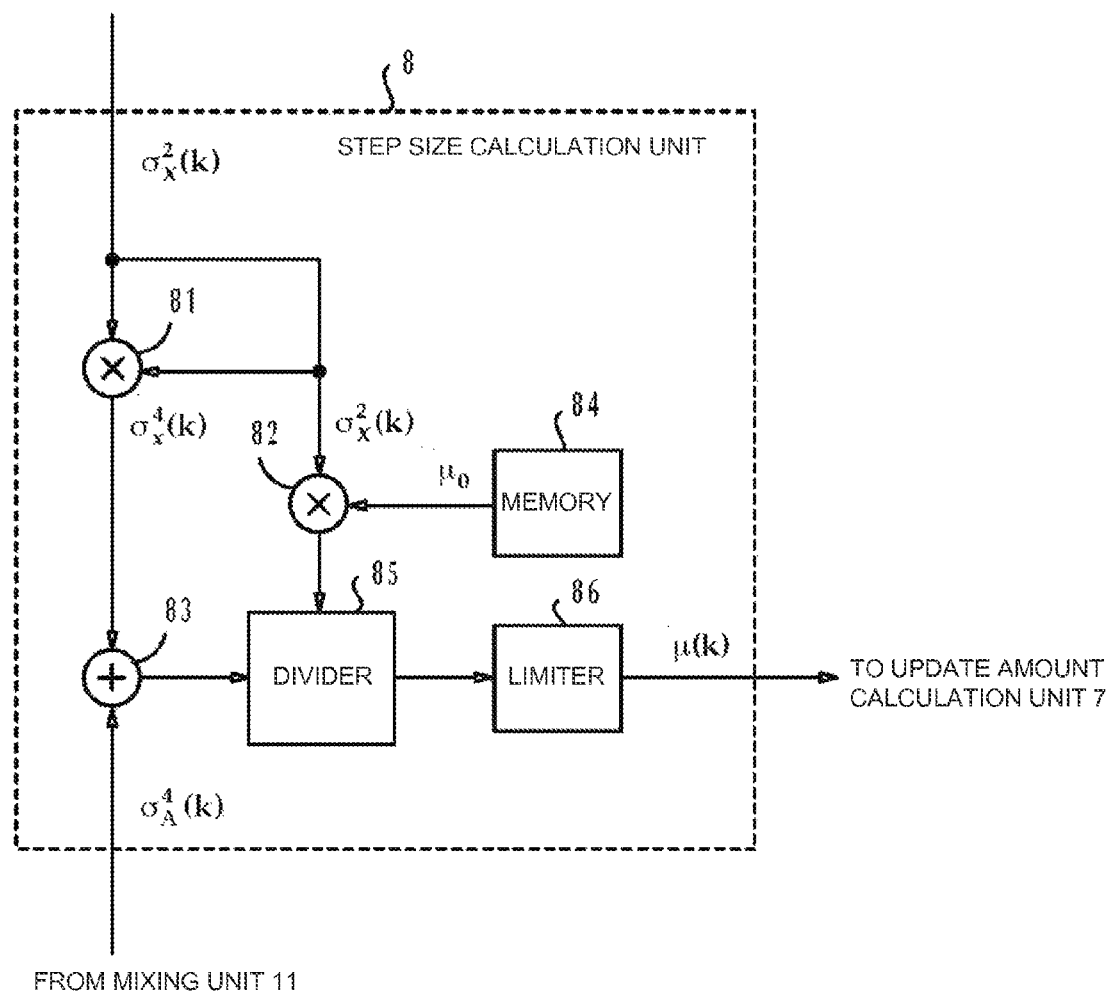
FIG. 3 is a block diagram illustrating a second configuration of the step size calculation unit of FIG. 1.

FIG. 3 shows a second configuration of the step size calculation unit 8. A point in which it differs from the first configuration of FIG. 2 is that a limiter 86 is connected to an output of the divider 85. The limiter 86 detects a maximum value of the step size μ(k), being an output of the divider 85, and compares this maximum value with s pre-decided constant. When the above maximum value is smaller than the constant, the limier 86 outputs the step size μ(k) as it stands, and when the above maximum value is larger than the constant, the limier 86 outputs this constant as a new step size. It is known that defining the maximum value of the step size as ⅓ trace {Rx(k)} is good in the NLSM algorithm. Where trace {•} is a total sum of diagonal components of a matrix, and Rx(k) is an autocorrelation matrix of the reference input signal of which the size is equal to the number of the taps of the adaptive filter at a time k. At this time, the step size μ(k) is expressed with the following equation.

[Numerical equation 10]

$$\mu(k) = \min\left\{\frac{\mu_0 \sigma_x^2(k)}{\sigma_x^4(k) + \sigma_A^4(k)}, \frac{1}{3 \text{ trace } \{R_x(k)\}}\right\} \quad (10)$$

Figure 4:
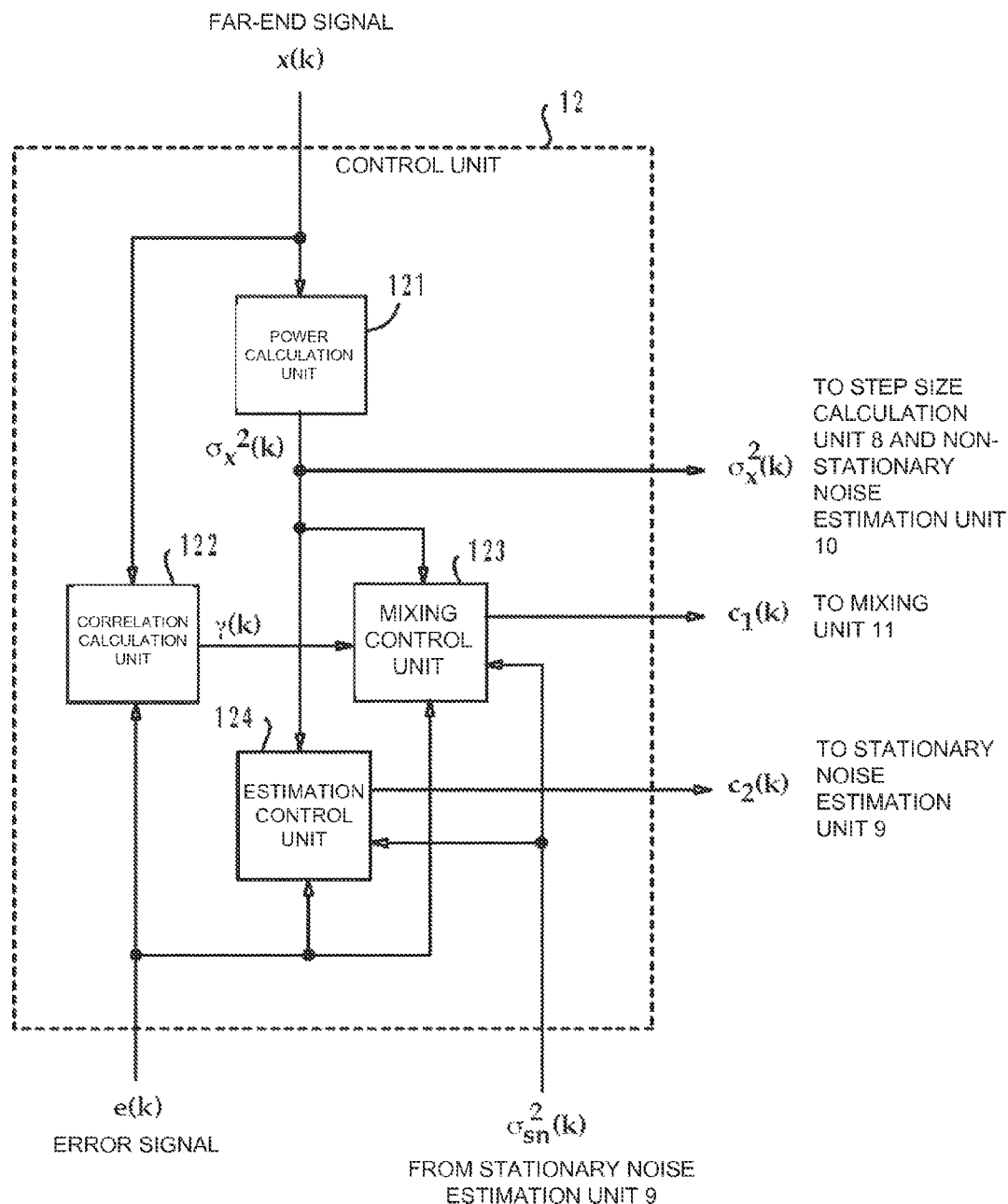
FIG. 4 is a block diagram illustrating a control unit of FIG. 1.

As shown in FIG. 4, the control unit 12 is comprised of a power calculation unit 121, a correlation calculation unit 122, a mixing control unit 123, and an estimation control unit 124. The control unit 12 inputs the reference input (far-end) signal x(k), the error signal e(k), and the stationary noise power estimated value $\sigma sn^2(k)$, and calculates the reference input signal power $\sigma x^2(k)$, the mixing control signal $c_1(k)$, and the noise estimation control signal $c_2(k)$. The reference input signal x(k) is supplied to the power calculation unit 121 and the correlation calculation unit 122. The power calculation unit 121 calculates the reference input signal power $\sigma x^2(k)$ from this reference input signal x(k), conveys it to the mixing control unit 123, and the estimation control unit 124, and simultaneously therewith, outputs this to the step size calculation unit 8 and the non-stationary noise estimation unit 10. The error signal e(k) is supplied to the correlation calculation unit 122, the mixing control unit 123, and the estimation control unit 124.

The correlation calculation unit 122 obtains a correlation value between the supplied reference input signal x(k) and error signal e(k), compares this correlation value with a pre-decided threshold, and supplies a mutual comparison results as an index γ(k) of correlation to the mixing control unit 123.

γ(k)=1 when the correlation value is higher than the threshold, and γ(k)=0 when the correlation value is lower. The fact that a high correlation exists between the reference input signal x(k) and the error signal e(k) signifies the situation in which the echo has not been erased sufficiently. That is, it is due to one of the fact that the adaptive filter coefficient is in a course of initial convergence, and the fact that the adaptive filter coefficient is an inadequate value because the characteristic of an echo path (an acoustic path from the loudspeaker to the microphone) has been just changed. Thus, it is necessary to set the coefficient update step size to a large value so as to accelerate the update of the adaptive filter coefficient when the adaptive filter coefficient is in such a situation.

For this, the mixing control unit 123 inputs the above-mentioned index γ(k) of correlation from the correlation calculation unit 122 besides the reference input signal power σx²(k), the error signal e(k), and the stationary noise power estimated value σsn²(k), and calculates the mixing control signal $c_1(k)$ from these values. The control of the mixing is taken based upon stationarity of the error signal e(k). The mixing control signal $c_1(k)$ can be obtained with the error signal power e²(k) defined as an index because the value of the error signal ought to be close to the current stationary noise power estimated value when the error signal is stationary. An example of obtaining the mixing control signal $c_1(k)$, correspondingly to a difference with the current stationary noise estimated value, on the basis of this principle is shown in Numerical equation 11.

[Numerical equation 11]

$$c_1(k) = \min\left\{1, \max\left\{\frac{e^2(k) - \varepsilon_1}{\varepsilon_2 - \varepsilon_1}, 0\right\}\right\} \quad (11)$$

Where each of $\varepsilon_1$ and $\varepsilon_2$ is an index value, and max {•} is a function extracting the maximum value. That is, $c_1(k)$ is decided, depending upon the position in which the error signal power e²(k) is located in terms of the index values $\varepsilon_1$ and $\varepsilon_2$. $\varepsilon_1$ and $\varepsilon_2$ are decided so that a relation of $\varepsilon_1 < e^2(k) < \varepsilon_2$ is satisfied. While, in the Numerical equation 11, $c_1(k)$ is defined as a linear function of e²(k) in a block that lies between $\varepsilon_1$ and $\varepsilon_2$, the function could be an arbitrary high-dimensional function. As a special example of the Numerical equation 11, the following equation can be obtained when $\varepsilon_1$=0.

[Numerical equation 12]

$$c_1(k) = \min\left\{1, \max\left\{\frac{e^2(k)}{\varepsilon_2}, 0\right\}\right\} \quad (12)$$

Another example of obtaining the mixing control signal, correspondingly to a difference with the current stationary noise estimated value, is shown in Numerical equation 13.

[Numerical equation 13]

$$c_1(k) = \max\{\mathrm{sgn}\{e^2(k) - \varepsilon_2, 0\}\} \quad (13)$$

That is, $c_1(k)$=1 when e²(k) is larger than $\varepsilon_2$, and $c_1(k)$=0 otherwise. As a special example of the Numerical equation 12 and the Numerical equation 13, $\varepsilon_2$ can be defined as $\varepsilon_2 = \varepsilon_0 \sigma sn^2(k)$. At this time, each of the Numerical equation 12 and the Numerical equation 13 can be expressed as follows.

[Numerical equation 14]

$$c_1(k) = \min\left\{1, \max\left\{\frac{e^2(k)}{\varepsilon_0 \sigma_{sn}^2(k)}, 0\right\}\right\} \quad (14)$$

[Numerical equation 15]

$$c_1(k) = \max\{\mathrm{sgn}\{e^2(k) - \varepsilon_0 \sigma_{sn}^2(k), 0\}\} \quad (15)$$

Upon combining the Numerical equation 5 and Numerical equation 15, the equations can be simplified as follows.

[Numerical equation 16]

$$\sigma_A^2(k) = \begin{cases} \sigma_{sn}^4(k) & e^2(k) < \varepsilon_0 \sigma_{sn}^2(k) \\ \sigma_{nn}^4(k) & \text{otherwise} \end{cases} \quad (16)$$

When the mixing control unit 123 sets $c_1(k)$ to 1, the mixing unit 11 supplies only the stationary noise term to the step size calculation unit 8 according to the Numerical equation 8. Thus, When the mixing control unit 123 sets $c_1(k)$ to 0, the mixing unit 11 supplies the non-stationary noise term to the step size calculation unit 8 according to the Numerical equation 8.

Figure 5:
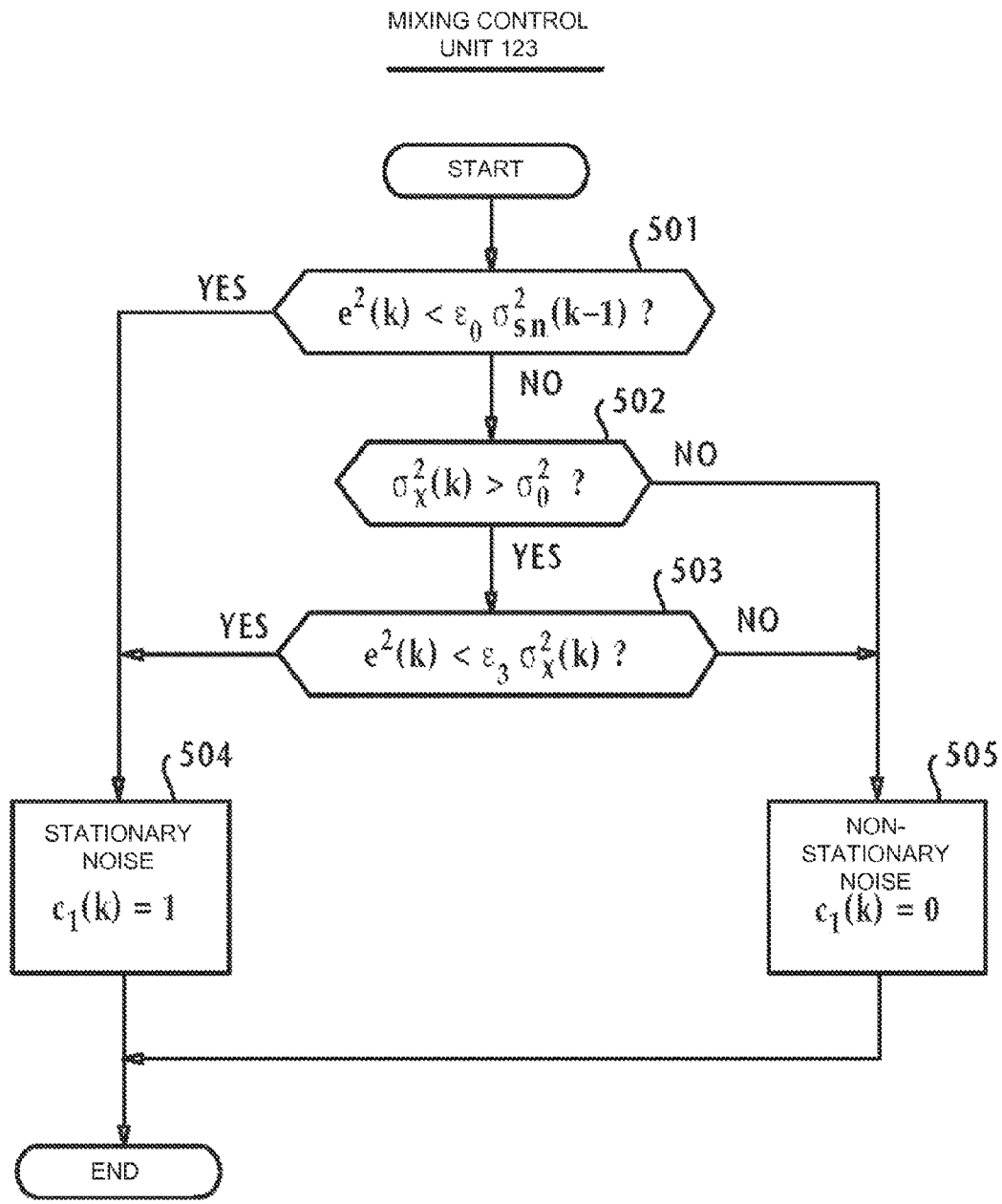
FIG. 5 is a flowchart illustrating an operation of a mixing control unit.

At this time, the step size μ(k) is set to a relatively large value, and hence, a convergence speed becomes high, and a residual echo becomes much. Such a setting is desirable at the time of the initial convergence, which necessitate a high-speed convergence, or at the time that a fluctuation in the echo path has occurred. The mixing control unit 123 can be also configured to forcibly set $c_1(k)$ to $c_1(k)$=1 when γ(k)=1 because the initial convergence and the fluctuation in the echo path are expressed with γ(k)=1. Further, the mixing control unit 123 can obtain the mixing control signal according to a flowchart of FIG. 5 when γ(k)=1. At first, the mixing control unit 123 compares the error signal power e²(k) with the stationary noise power estimated value σsn²(k) at a first determination (step 501). When the error signal is smaller, a determination result of the step 501 is YES, and the mixing control unit 123 sets $c_1(k)$ to 1 (step 504) because it is thinkable that the stationary noise of the background is dominant in this error signal.

When the error signal is larger than the stationary noise power estimated value, the large signal component other than the stationary noise is dominant in this error signal. This large signal component is either the residual echo or the near-end signal. This is determined with magnitude of the reference input signal power σx²(k)(step 502). This is a second determination. Namely, when the reference input signal power σx²(k) is smaller than a pre-decided threshold σ0², a determination result of the step 502 is NO, and the mixing control unit 123 sets $c_1(k)$ to 0 in a step 505 because that the non-stationary noise is dominant in the error signal.

The mixing control unit 123 makes a third determination in a step 503, and compares the error signal power e²(k) with the reference input signal power σx²(k) because there is a possibility that the residual echo exists when the determination result of the step 502 is YES. That is, when the determination result of the step 503 is YES, the reference input signal passes through the echo path having a low-pass characteristic, and becomes the echo. The error signal power $e^2(k)$ is smaller than the reference input signal power $\sigma x^2(k)$ even though the echo is not erased completely because the echo path is of a damping system. Employing this property makes it possible to determine that no residual echo exists when the error signal power $e^2(k)$ is smaller than a constant $(\epsilon_3)$ times the reference input signal power $\sigma x^2(k)$, whereby it is determined that the stationary noise of the background is dominant in this error signal, and thus, the determination result of the step 503 is YES and the mixing control unit 123 sets $c_1(k)$ to 1 in a step 504. When the error signal power is larger, it means that the component other than the echo is included, whereby the mixing control unit 123 determines that the non-stationary noise is a governing component of the error signal, and sets $c_1(k)$ to 0 in a step 506.

The estimation control unit 124 calculates the noise estimation control signal $c_2(k)$ from the inputted the reference input signal power $\sigma x^2(k)$, error signal $e(k)$, and stationary noise power estimated value $\sigma sn^2(k)$. The noise estimation control signal $c_2(k)$ is determined with two conditions, i.e. the condition that a possibility that the echo exists is small, and the condition that the error signal is not remarkably large as compared with the stationary noise. The possibility that the echo exists is evaluated by comparing the error signal power with the reference input signal power because the possibility that the echo exists can be grasped from the reference input signal. That is, the noise estimation control signal $c_2(k)$ is obtained with the following equation.

[Numerical equation 17]

$$c_2(k) = \begin{cases} 1 & \sigma_x^2(k) < \sigma_0^2 \text{ and } e^2(k) < \varepsilon_4 \sigma_{sn}^2(k) \\ 0 & \text{otherwise} \end{cases} \quad (17)$$

Where $\epsilon_4$ is a pre-decided constant. $c_2(k)=1$ only when the above-mentioned two conditions are simultaneously satisfied, and $c_2(k)=0$ otherwise. Further, the condition that the error signal is not remarkably large as compared with the stationary noise can be also replaced with the condition that the error signal does not remarkably differ from the stationary noise. It can be easily understood that this condition is justified so long as the noise is stationary. At this time, $c_2(k)$ can be obtained with the condition of the following equation by employing another constant $\epsilon_4$.

[Numerical equation 18]

$$c_2(k) = \begin{cases} 1 & \sigma_x^2(k) < \sigma_0^2 \text{ and } \varepsilon_5 \sigma_{sn}^2(k) < e^2(k) < \varepsilon_4 \sigma_{sn}^2(k) \\ 0 & \text{otherwise} \end{cases} \quad (18)$$

Figure 6:
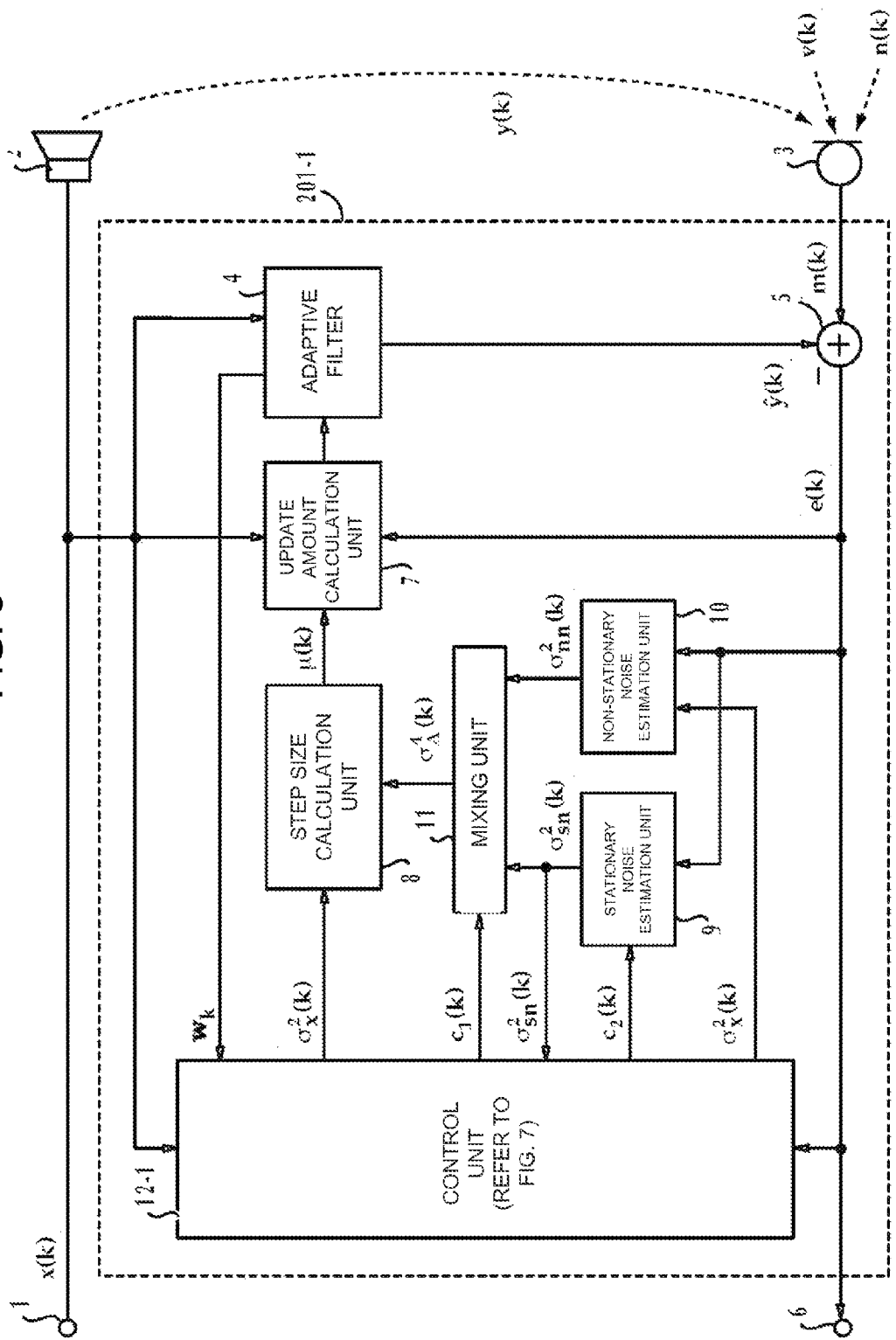
FIG. 6 is a block diagram illustrating a second embodiment of the present invention.

Next, the second embodiment of the present invention will be explained by making a reference to FIG. 6. This embodiment differs from the previous embodiment in a point that a coefficient vector $w(k)$ is supplied to a control unit 12-1 from the adaptive filter. The control unit 12-1 determines a convergence of the adaptive filter coefficient by employing this coefficient vector $w(k)$, and operates in such a manner that the operation before the convergence differs from the operation after the convergence.

Figure 7:
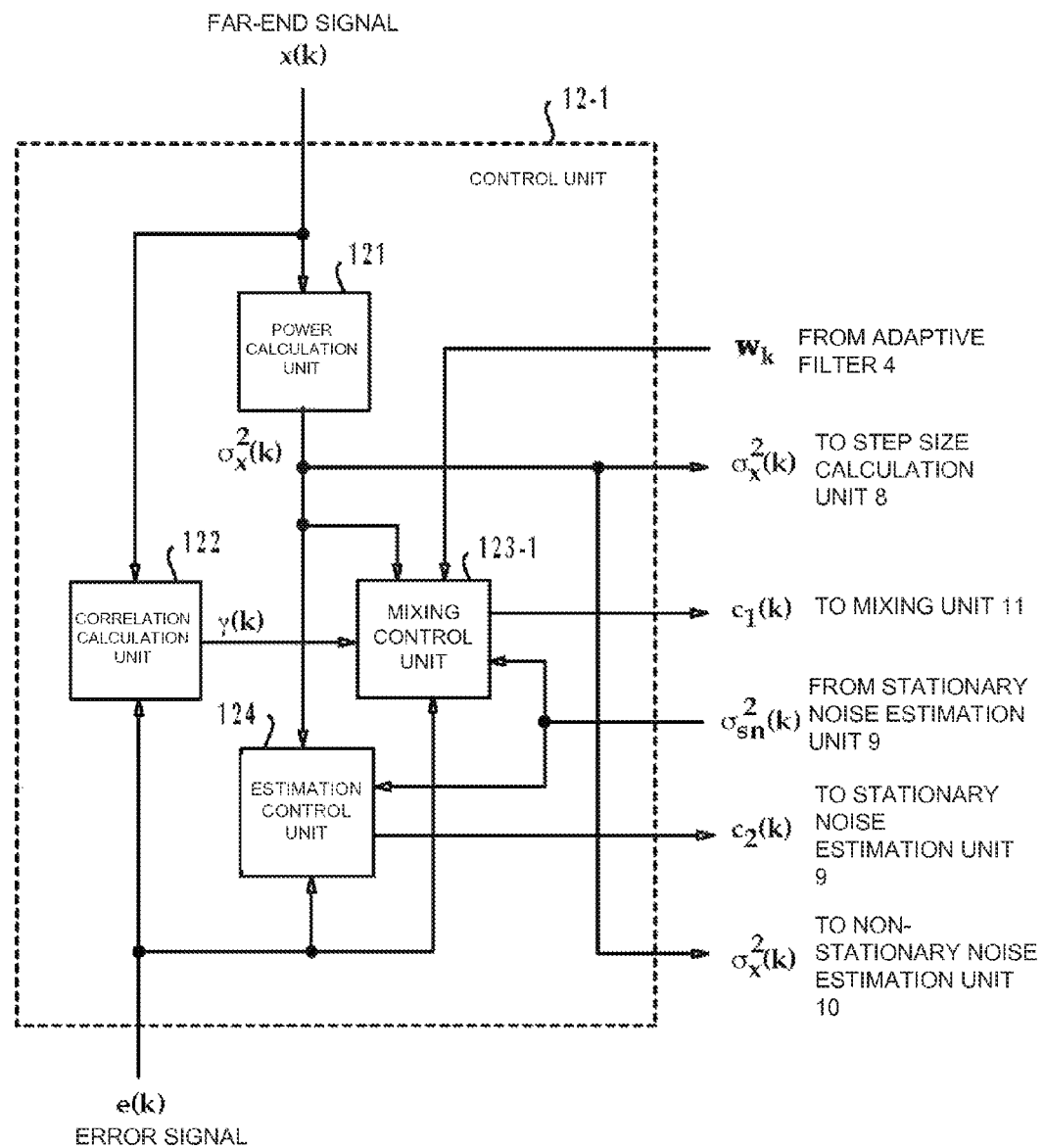
FIG. 7 is a block diagram illustrating the control unit of FIG. 6.

As shown in FIG. 7, the control unit 12-1 is comprised of a power calculation unit 121, a correlation calculation unit 122, a mixing control unit 123-1, and an estimation control unit 124. The portion shown with a reference number identical to the previous number of the previous embodiment has a function identical to the function of the previous embodiment, so its explanation is omitted. The control unit 12-1 inputs the reference input signal $x(k)$, the error signal $e(k)$, the stationary noise power estimated value $\sigma sn^2(k)$, and the coefficient vector $w(k)$ of the adaptive filter, and calculates the reference input signal power $\sigma x^2(k)$, the mixing control signal $c_1(k)$, and the noise estimation control signal $c_2(k)$.

The mixing control unit 123-1, similarly to the mixing control unit of the previous embodiment, inputs the reference input signal power $\sigma x^2(k)$, the error signal $e(k)$, the stationary noise power estimated value $\sigma sn^2(k)$, and the index $\gamma(k)$ of correlation. In this embodiment, the mixing control unit 123-1 further inputs the coefficient vector $w(k)$ from the adaptive filter 4, and calculates the mixing control signal $c_1(k)$.

The adaptive filter coefficient gradually augments from zero simultaneously with commencement of the normal adaptive operation. The adaptive filter coefficient is saturated and becomes approximately a constant value when it approaches the convergence situation. A change in a sum of squared values of the adaptive filter coefficients is monitored based upon this property, and it is determined that the adaptive filter coefficient has reached the convergence situation when the change amount becomes little. A similar effect can be gained also by monitoring a change in a sum of squared values of one part of the adaptive filter coefficients. In particular, the region in which the coefficient value is large is effectively monitored. A change $\theta(k)$ in a sum of squared values of the adaptive filter coefficients is expressed with the following equation.

[Numerical equation 19]

$$\theta(k) = \frac{S_w(k) - S_w(k-1)}{S_w(k)} \quad (19)$$

[Numerical equation 20]

$$S_w(k) = \text{trace}\{w^T(k)w(k)\} \quad (20)$$

In such a manner, by employing a normalized change amount obtained by normalizing a change amount of a sum of squared values of the adaptive filter coefficients by a sum of the coefficient values, it can be detected accurately that the adaptive filter 4 has reached the convergence situation. In the case of monitoring one part of the filter coefficients, it is enough to replace the coefficient vector $w(k)$ with the vector of the above part in the Numerical equation 20. It is determined that the coefficient has been converged when $\theta(k)$ becomes smaller than the threshold. The mixing control unit 123-1 forcibly sets $c_1(k)$ to $c_1(k)=1$ before it is determined that $\theta(k)$ has become smaller than the threshold, or when $\gamma(k)=1$.

Figure 8:
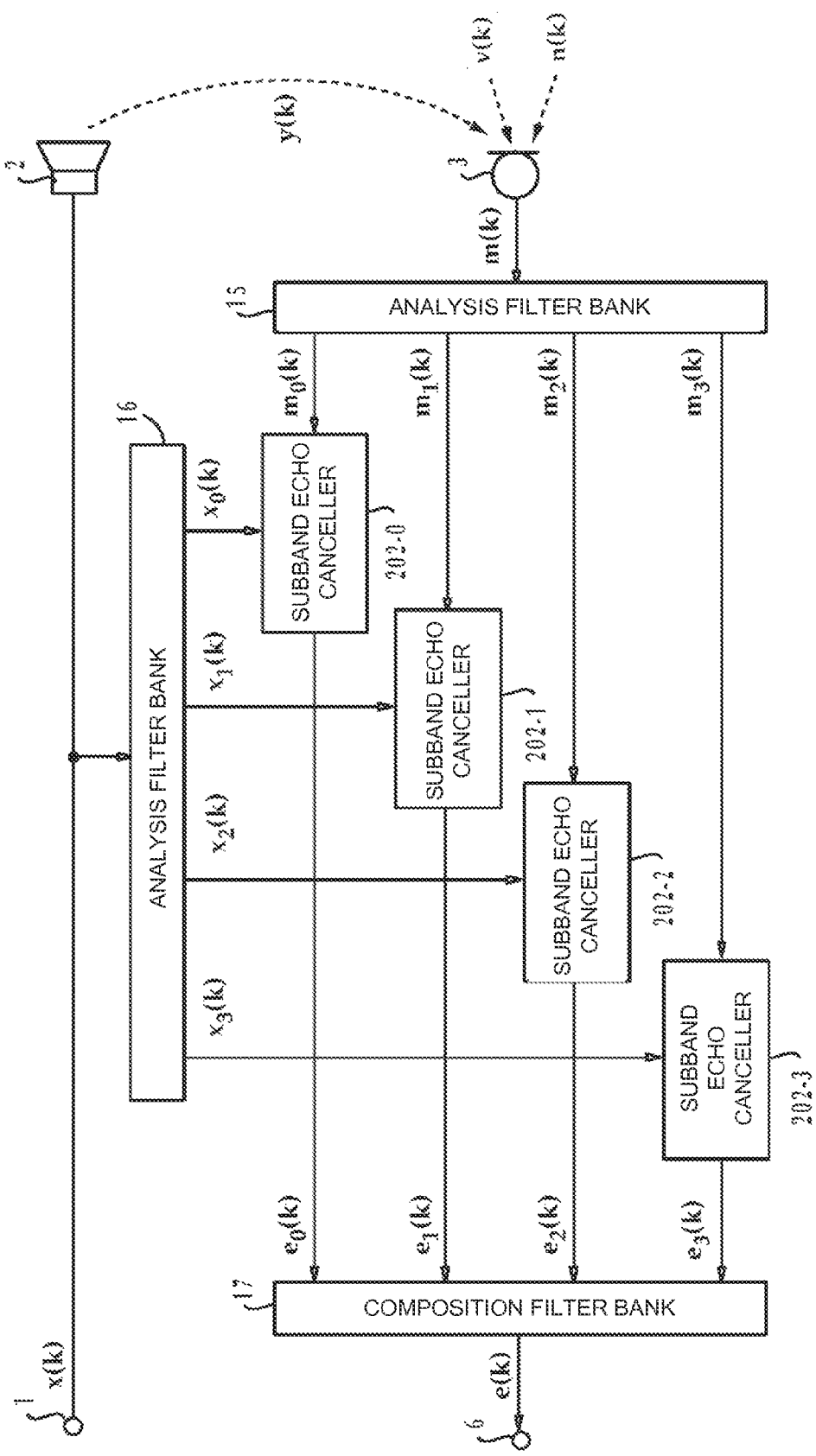
FIG. 8 is a block diagram illustrating a third embodiment of the present invention.

Next, FIG. 8 shows the third embodiment of the present invention as one modification example of the echo canceller. By dividing the far-end signal $x(k)$ being supplied from the input terminal 1 and the microphone signal $m(k)$ being supplied from the microphone 3 into a plurality of frequency bands (subbands), performing a process identical to the process of the first embodiment in each subband, and composing the gained bands of the output, the echo erase output (error signal) e(k) is gained. For this, the third embodiment includes analysis filter banks 15 and 16, and a composition filter bank 17. Applying thinning-out for the subband-divided signals enables an arithmetic amount to be curtailed. The analysis filter bank 15 divides the supplied microphone signal m(k) into a plurality of the frequency bands (subbands).

The case of dividing the signal into four subbands is shown as one example. The analysis filter bank 15 further performs a process of lowering a sampling rate (thinning-out process) for each subband, and supplies the divided signals as sunband signals $m_0(k)$, $m_1(k)$, $m_2(k)$ and $m_3(k)$ to subband echo cancellers $202_0$, $202_1$, $202_2$, and $202_3$, respectively. The ratio of the thinning-out is equal to or less than the number of the subbands. In particular, performing the thinning-out at a ratio equal to the number of the subbands causes aliasing to occur in the signal subjected to the thinning-out, which gives rise to a decline in a performance. For this, normally, oversampling is performed by applying the thinning-out rate smaller than the number of the subbands. On the other hand, the reference input signal x(k) supplied to the analysis filter bank 16 is similarly divided into a plurality of subbands, thined out at a thinning-out rate identical to the thinning-out rate of the analysis filter bank 15, and supplied as sunband reference input signals $x_0(k)$, $x_1(k)$, $x_2(k)$ and $x_3(k)$ to the subband echo cancellers $202_0$, $202_1$, $202_2$, and $202_3$, respectively.

These sunband echo cancellers input the subband microphone signals and the subband reference input signals that corresponds hereto, generate subband echo erase signals $e_0(k)$, $e_1(k)$, $e_2(k)$ and $e_3(k)$, and supply them to the composition filter bank 17. The composition filter bank 17 performs a process of raising the sampling rate by applying an interpolation of which an interpolation ratio is identical to the ratio of the foregoing thinning-out for these subband echo erase signals, and integrates these into the echo erase signal e(k). Additionally, a configuration, an operation, a design method or the like of the analysis filter bank and the composition filter bank are described in details in the Non-patent document 5, so the detailed explanation thereof is omitted.

Figure 9:
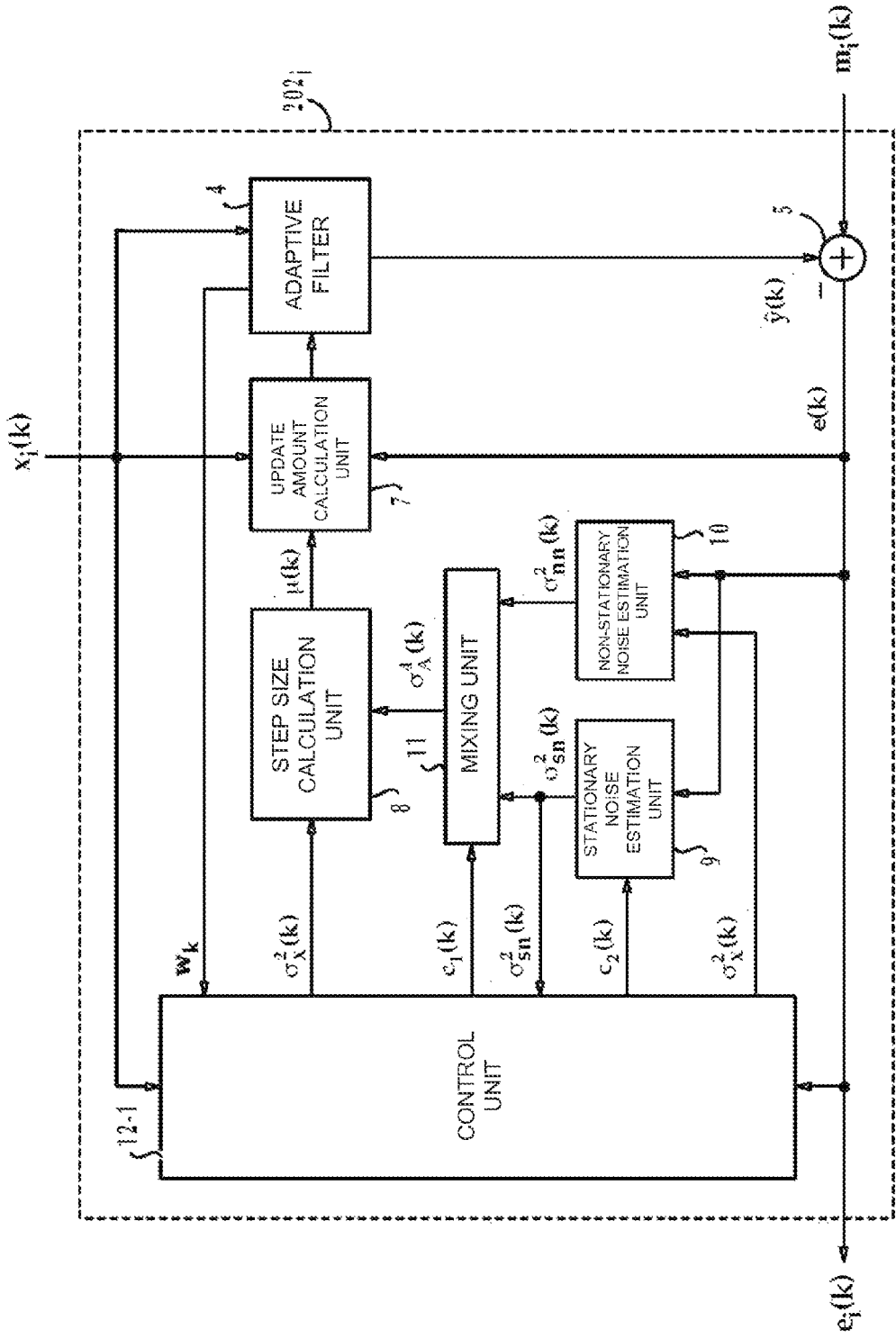
FIG. 9 is a block diagram illustrating each subband echo canceller of FIG. 8.

FIG. 9 shows the details of each subband echo canceller $202_i$. The subband echo canceller $202_i$ assumes a configuration identical to the configuration of the echo canceller 201-1 shown in FIG. 6, and a basic operation thereof is also identical. A sole difference with the echo canceller 201-1 is that the signals being supplied have been thin out, and the sampling rate is low. A subband echo canceller $202_i$ to which a subband microphone signal $m_i(k)$ and a subband reference input signal $x_i(k)$ have been provided from the analysis filter bank 15 and the analysis filter bank 16, respectively, calculates a subband echo erase signal $e_i(k)$, and conveys it to the composition filter bank 17. The echo canceller 201 of FIG. 1 may be employed as the subband echo canceller $202_i$ of FIG. 9 because the subband echo canceller $202_i$ of FIG. 9 is identical to the echo canceller 201-1 of FIG. 6 in a configuration and an operation. Further, the initial value of the stationary noise estimated value in each subband may be obtained with a method identical to the method of the first embodiment, and the value obtained by averaging the values obtained in respective subbands in terms of a plurality of the subbands may be employed. This averaging scheme is effective from a viewpoint of reducing dispersion of the noise estimation initial values in respective subbands, and attaining excellent echo erase characteristic. Additionally, for the technical details of the subband echo canceller, the Non-patent document 6 can be referenced.

Figure 10:
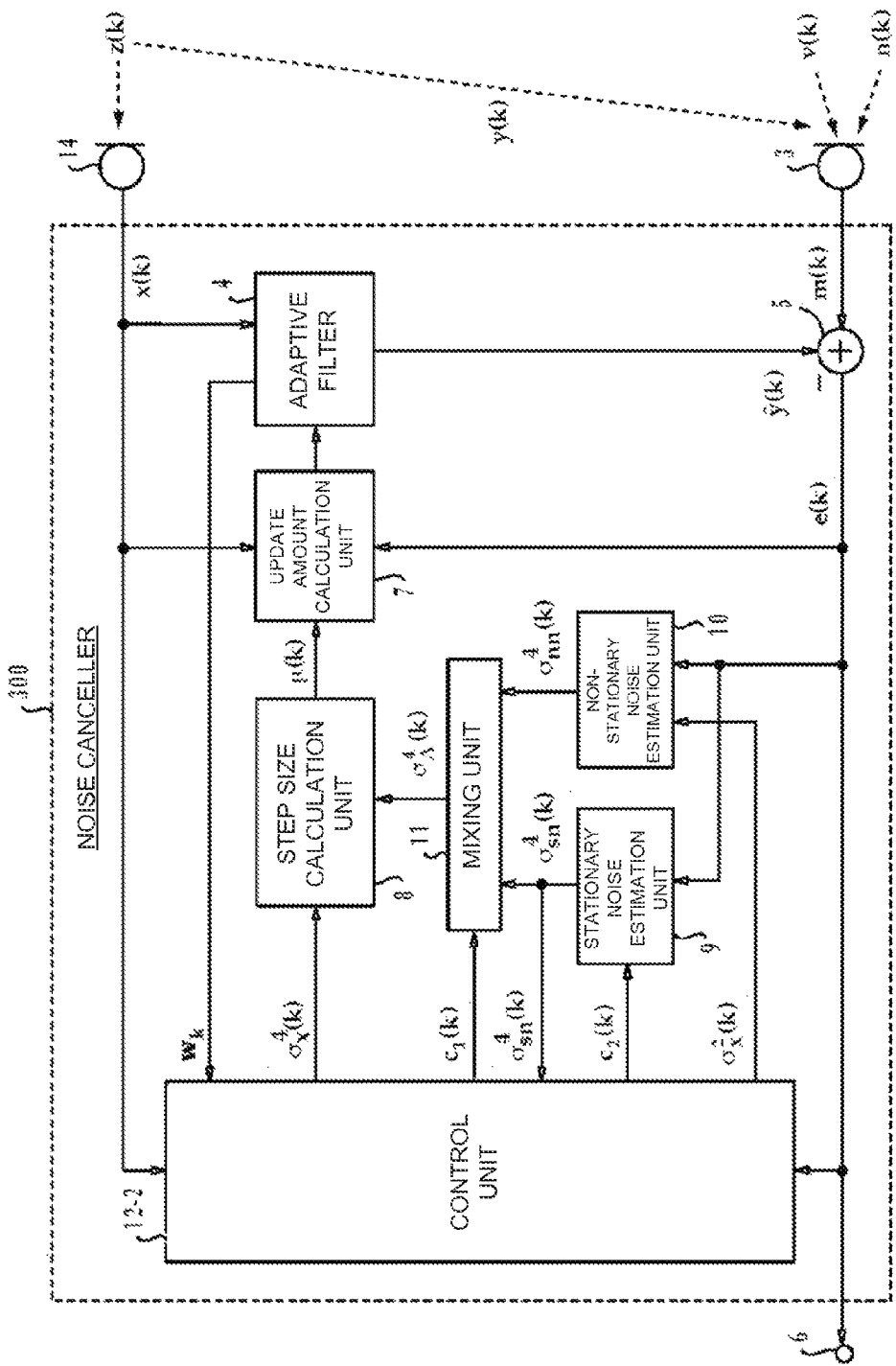
FIG. 10 is a block diagram illustrating a fourth embodiment of the present invention.

FIG. 10 shows a noise canceller as the fourth embodiment of the present invention. A noise canceller 300 includes a microphone 14 besides the microphone 3. Differently from the case of the echo cancellers of FIG. 1 and FIG. 6, an input z(k) to the microphone 14 is converted into the reference input signal x(k), inputted into the noise canceller 300, transmitted through a space, and detected as a noise y(k) by the microphone 3. So as to erase the noise y(k), which enters the microphone 3, and disturbs the target signal v(k), the signal x(k) having a correlation with the noise y(k) is utilized. y(k) is a noise of which a noise source z(k) has been propagated through the acoustic space, and has reached the microphones 3, and x(k) is a signal of which a noise source z(k) has have been propagated through the acoustic space, and has reached the microphones 14, and both have a large correlation with each other. For this, generating a noise replica y(k)-hat by processing the reference input signal x(k) with the adaptive filter 4, and subtracting this from the microphone signal with the subtracter 5 enables y(k) to be erased. The first and the second embodiments are identical to each other in an operation of the adaptive filter 4 and its coefficient update.

What is claimed is:

1. An adaptive filter coefficient update method of receiving a mixture containing a target signal, a particular signal that should be canceled, a stationary noise, and a non-stationary noise, subtracting an adaptive filter output from the above mixture, and obtaining an error signal, comprising:
    (a) a process of estimating a stationary noise, by a stationary noise estimation unit, from said error signal and obtaining a stationary noise estimated value;
    (b) a process of estimating a non-stationary noise, by a non-stationary noise estimation unit, from said error signal and obtaining a non-stationary noise estimated value;
    (c) a process of mixing said stationary noise estimated value and said non-stationary noise estimated value, by a mixing unit, and obtaining a mixed noise estimated value;
    (d) a process of calculating a coefficient update step size, by a step size calculation unit, such that the coefficient update step size takes a value between 0 and 1 based on said mixed noise estimated value; and
    (e) a process of updating a coefficient of the adaptive filter, by an update amount calculation unit, by employing the above step size.

2. The adaptive filter coefficient update method according to claim 1, wherein said process (a) obtains a new stationary noise estimated value when a power of said reference input signal is smaller than a predetermined value, and said error signal is smaller than said stationary noise estimated value multiplied by a constant.

3. The adaptive filter coefficient update method according to claim 1, wherein said process (a) obtains said stationary noise estimated value when said reference input signal power is smaller than the predetermined value, and said error signal is larger than a constant times said stationary noise estimated value, or when said reference input signal power is larger than the predetermined value, and said error signal is larger than a constant times said stationary noise estimated value.

4. The adaptive filter coefficient update method according to claim 1, wherein said process (c) controls a ratio of said stationary noise estimated value and said non-stationary noise estimated value being included in said mixed noise estimated value so that the stationary noise estimated value is included more than the non-stationary noise estimated value when a difference between a power of said error signal and said stationary noise estimated value is smaller than a predetermined value close to 0.

5. The adaptive filter coefficient update method according to claim 4, wherein said process (c) controls said ratio based upon a coefficient vector of said adaptive filter.

6. An adaptive filter coefficient update device that receives a mixture containing a target signal, a particular signal that should be canceled, a stationary noise, and a non-stationary noise, subtracts an adaptive filter output from the above mixture, and obtains an error signal, said adaptive filter coefficient update device comprising:
- a stationary noise estimation unit that estimates a stationary noise from said error signal and obtains a stationary noise estimated value;
- a non-stationary noise estimation unit that estimates a non-stationary noise from said error signal and obtains a non-stationary noise estimated value;
- a mixing unit that mixes said stationary noise estimated value and said non-stationary noise estimated value, and obtains a mixed noise estimated value;
- a step size calculation unit that calculates a coefficient update step size such that the coefficient update step size takes a value between 0 and 1 based on said mixed noise estimated value; and
- an update amount calculation unit that calculates an update amount for updating a coefficient of the adaptive filter by employing the above step size.

\* \* \* \* \*